(12) United States Patent
Guo et al.

(10) Patent No.: US 9,466,699 B2
(45) Date of Patent: Oct. 11, 2016

(54) MANUFACTURING METHOD FOR VERTICAL CHANNEL GATE-ALL-AROUND MOSFET BY EPITAXY PROCESSES

(71) Applicant: SHANGHAI IC&D CENTER CO., LTD., Shanghai (CN)

(72) Inventors: Ao Guo, Shanghai (CN); Zheng Ren, Shanghai (CN); Shaojian Hu, Shanghai (CN); Wei Zhou, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 15/033,097

(22) PCT Filed: Jul. 18, 2014

(86) PCT No.: PCT/CN2014/082440
§ 371 (c)(1),
(2) Date: Apr. 28, 2016

(87) PCT Pub. No.: WO2015/096467
PCT Pub. Date: Jul. 2, 2015

(65) Prior Publication Data
US 2016/0268396 A1    Sep. 15, 2016

(30) Foreign Application Priority Data

Dec. 27, 2013  (CN) .......................... 2013 1 0742875

(51) Int. Cl.
*H01L 21/336* (2006.01)
*H01L 29/66* (2006.01)
*H01L 29/786* (2006.01)
*H01L 29/78* (2006.01)
*H01L 29/423* (2006.01)
*H01L 27/12* (2006.01)
*H01L 21/265* (2006.01)
*H01L 21/02* (2006.01)
*H01L 21/3105* (2006.01)

(52) U.S. Cl.
CPC ..... *H01L 29/66666* (2013.01); *H01L 21/0228* (2013.01); *H01L 21/02233* (2013.01); *H01L 21/265* (2013.01); *H01L 21/31055* (2013.01); *H01L 27/1203* (2013.01); *H01L 29/42392* (2013.01); *H01L 29/66742* (2013.01); *H01L 29/7827* (2013.01); *H01L 29/78642* (2013.01)

(58) Field of Classification Search
None
See application file for complete search history.

(56) References Cited

U.S. PATENT DOCUMENTS

2011/0233512 A1*  9/2011  Yang ................ B82Y 10/00
257/9

* cited by examiner

*Primary Examiner* — Reema Patel

(57) ABSTRACT

A manufacturing method is provided for fabricating a vertical channel gate-all-around MOSFET by epitaxy processes. The method includes growing a first epitaxial layer on a top semiconducting layer of a substrate; etching the first epitaxial layer and the top layer to form a first source/drain pattern in the top layer; etching the first epitaxial layer to form a vertical channel structure; then forming a gate dielectric layer on the vertical channel structure surface; forming a sandwich structure composed of a bottom spacer layer, a gate electrode layer and a top spacer layer; etching the top spacer layer and the gate electrode layer to form a gate pattern followed by forming a top spacer structure thereon; growing a second epitaxial layer and etching to form a second source/drain pattern.

10 Claims, 7 Drawing Sheets

--Prior art--

MANUFACTURING METHOD FOR VERTICAL CHANNEL GATE-ALL-AROUND MOSFET BY EPITAXY PROCESSES

CROSS-REFERENCE TO RELATED APPLICATION

This application claims the priority benefit of International Patent Application Serial No. PCT/CN2014/082440, filed Jul. 18, 2014, which is related to and claims the priority benefit of China patent application serial No. 201310742875.4, filed Dec. 27, 2013. The entirety of each of the above-mentioned patent applications is hereby incorporated by reference herein and made a part of this specification.

FIELD OF THE INVENTION

The present invention relates to the field of semiconductor technology and more particularly to a method for manufacturing vertical channel gate-all-around MOSFETs by epitaxy processes.

BACKGROUND OF THE INVENTION

With the continuous scaling down of the semiconductor process technology node, the traditional planar-MOSFET is facing increasing challenges, such as the remarkable leakage current, the serious short channel effect, and the degraded subthreshold performance. With the scaling of the critical dimension of MOS device, the device fabrication relies increasingly on high precision lithography processes, which greatly limits the performance improvement of the planar-MOSFET. Thus, recently more and more researches explore MOSFETs with three-dimensional structures, and especially focus on the FinFETs and the multi-gate devices such as the representatively gate-all-around nanowire MOSFETs. The FinFET now has been considered as a novel device structure by the industry which will continue the scaling-down trend of the semiconductor process, and is expected to realize mass production in sub-20 nm technology node. The gate-all-around nanowire MOSFET is supposed to be the mainstream device structure for the next generation as a successor of the FinFET.

However, most of the gate-all-around MOSFETs studies presently are configured to have conductive channels parallel to the substrate surface. That is to say, suspended conductive channels are formed on the substrate surface before the gate-all-around gate electrode is fabricated. Such device structure makes a high demand for the fabrication process of the device, especially for the process of forming the suspended conductive channels, which cannot be realized easily by a mature manufacturing process presently. Another disadvantage of this structure is that the critical dimension of the gate electrode is still defined by the traditional lithography techniques, which limits the further reduction of the device size.

Thus, vertical channel gate-all-around MOSFET devices have been raised. FIG. 1 (Mark Bohr, IEDM, 2011) illustrates a conventional gate-all-around MOSFET structure including source/drain electrodes 103, conductive channels 102 and a gate electrode 101, wherein the conductive channels 102 are perpendicular to the substrate surface, and the gate electrode 101 surrounds the conductive channels 102 so as to form the gate-all-around device structure. A remarkable advantage of this structure is that it can be fabricated easily to achieve a desired subthreshold performance. Another noble advantage is that the critical dimension of the gate electrode can be defined by the thickness of the deposited layer through the deposition process without any photolithography technologies so that the device size can be further decreased easily. However, recently there still lacks a manufacturing process for the gate-all-around MOSFET with vertical channels which is compatible with the traditional CMOS process and allows the device to be fabricated by the conventional equipments so as to avoid the cost increasing and to overcome the process difficulties of the device with scaled size. Thus, it is significant to develop a method for fabricating vertical channel gate-all-around MOSFETs compatible with the traditional CMOS process.

BRIEF SUMMARY OF THE DISCLOSURE

Accordingly, at least one object of the present invention is to provide a manufacturing method of a vertical channel gate-all-around MOSFET by epitaxy processes well compatible with the conventional CMOS process in order to reduce the production cost and the process complexity.

The present invention provides a manufacturing method of a vertical channel gate-all-around MOSFET by epitaxy processes. The method includes the following steps:

Step S01: choosing a semiconductor substrate having a top semiconducting layer;

Step S02: growing a first epitaxial layer on the top semiconducting layer by an epitaxy process; wherein the material of the first epitaxial layer is different with that of the top semiconducting layer.

Step S03: forming a first source/drain pattern in the first epitaxial layer and the top semiconducting layer by photolithography and etching processes;

Step S04: forming a vertical channel structure in the first epitaxial layer by photolithography and etching processes;

Step S05: forming a gate dielectric layer on the surface of the vertical channel structure;

Step S06: forming a sandwich structure by depositing a bottom spacer layer, a gate electrode layer and a top spacer layer successively on the semiconductor substrate;

Step S07: forming a gate pattern in the top spacer layer and the gate electrode layer by photolithography and etching processes;

Step S08: forming a top spacer structure by depositing a dielectric layer on the patterned top spacer layer and the exposed bottom spacer layer, and then performing a planarization process to expose the top of the vertical channel structure;

Step S09: growing a second epitaxial layer on the top spacer layer by an epitaxy process;

Step S10: forming a second source/drain pattern in the second epitaxial layer by photolithography and etching processes.

Preferably, the vertical channel structure is formed on the first source/drain pattern; the top of the vertical channel structure passes through the gate electrode layer with the top thereof higher than that of the gate electrode layer; the second source/drain pattern naturally connects with the top of the vertical channel structure; wherein, when the first source/drain pattern is used as the source electrode, the second source/drain pattern is used as the drain electrode; when the first source/drain pattern is used as the drain electrode, the second source/drain pattern is used as the source electrode.

Preferably, the method further includes a step of source/drain implantation process in the top semiconducting layer of the substrate before growing the first epitaxial layer and a step of source/drain implantation process in the second epitaxial layer before forming the second source/drain pattern.

Preferably, the etching processes performed in the step S03, the step S04, the step S07 and the step S10 are anisotropic etching processes.

Preferably, in the step S05, the gate dielectric layer is formed by thermal oxidation or atomic layer deposition.

Preferably, the step S06 also includes planarizing the top spacer layer by chemical mechanical polishing.

Preferably, in the step S08, the dielectric layer is planarized by chemical mechanical polishing.

Preferably, the material of the second epitaxial layer is the same as that of the top semiconducting layer.

Preferably, the substrate is a silicon on insulator substrate or a germanium on insulator substrate; the first source/drain pattern and the second source/drain pattern are symmetrical.

Preferably, the materials of the first epitaxial layer, the second epitaxial layer and the top semiconducting layer are selected from Si, Ge, GeSi, and III-V compounds.

According to the manufacturing method of a vertical channel gate-all-around MOSFET by epitaxy processes of the present invention, the vertical channel gate-all-around MOSFET can be fabricated by performing two epitaxy processes to grow two epitaxial layers with different kinds of materials separately (the first epitaxial layer and the second epitaxial layer), which is compatible with the conventional CMOS process and allows the device to be fabricated by the conventional equipments so as to reduce the production cost. When the size of the vertical channel structure decreases, the method of the present invention can also be applied to manufacture vertical channel nanowire transistors, which overcomes the technical difficulties in manufacturing devices with smaller size than the FinFETs. Since various materials can be used in the epitaxy process, the manufacturing method of the gate-all-around MOSFET proposed in the present invention can be applied to fabricate FETs with different kinds of channel materials including Ge, GeSi, and III-IV compounds, which expands the application of the device.

DETAILED DESCRIPTION OF THE EMBODIMENTS

The present invention will now be descried more comprehensively hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
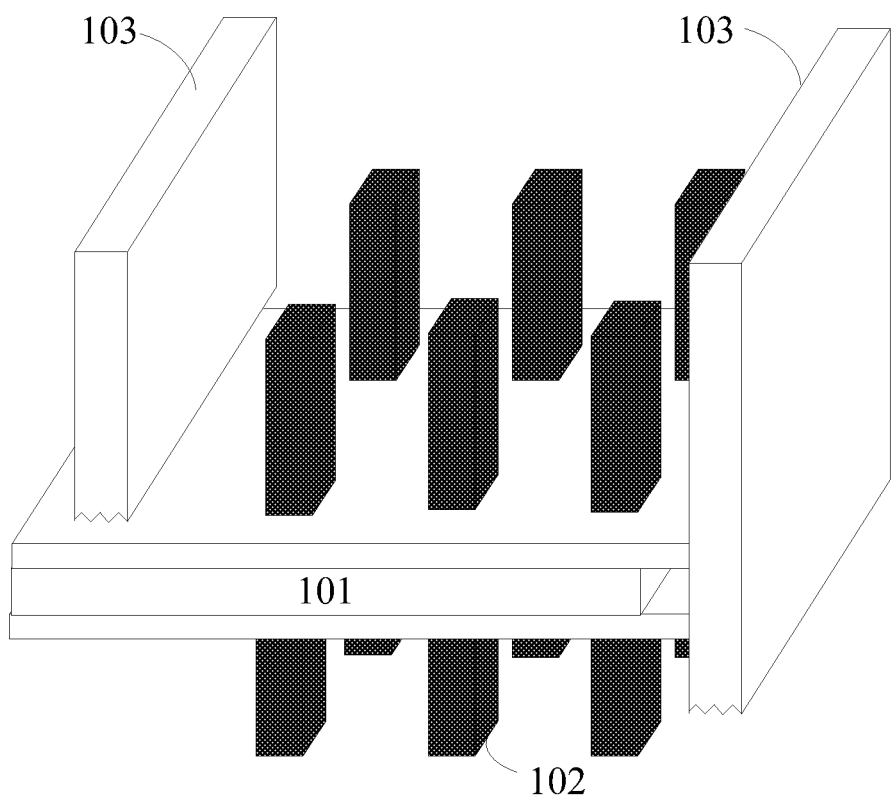
FIG. 1 is a structure view of a conventional gate-all-around MOSFET
Figure 2:
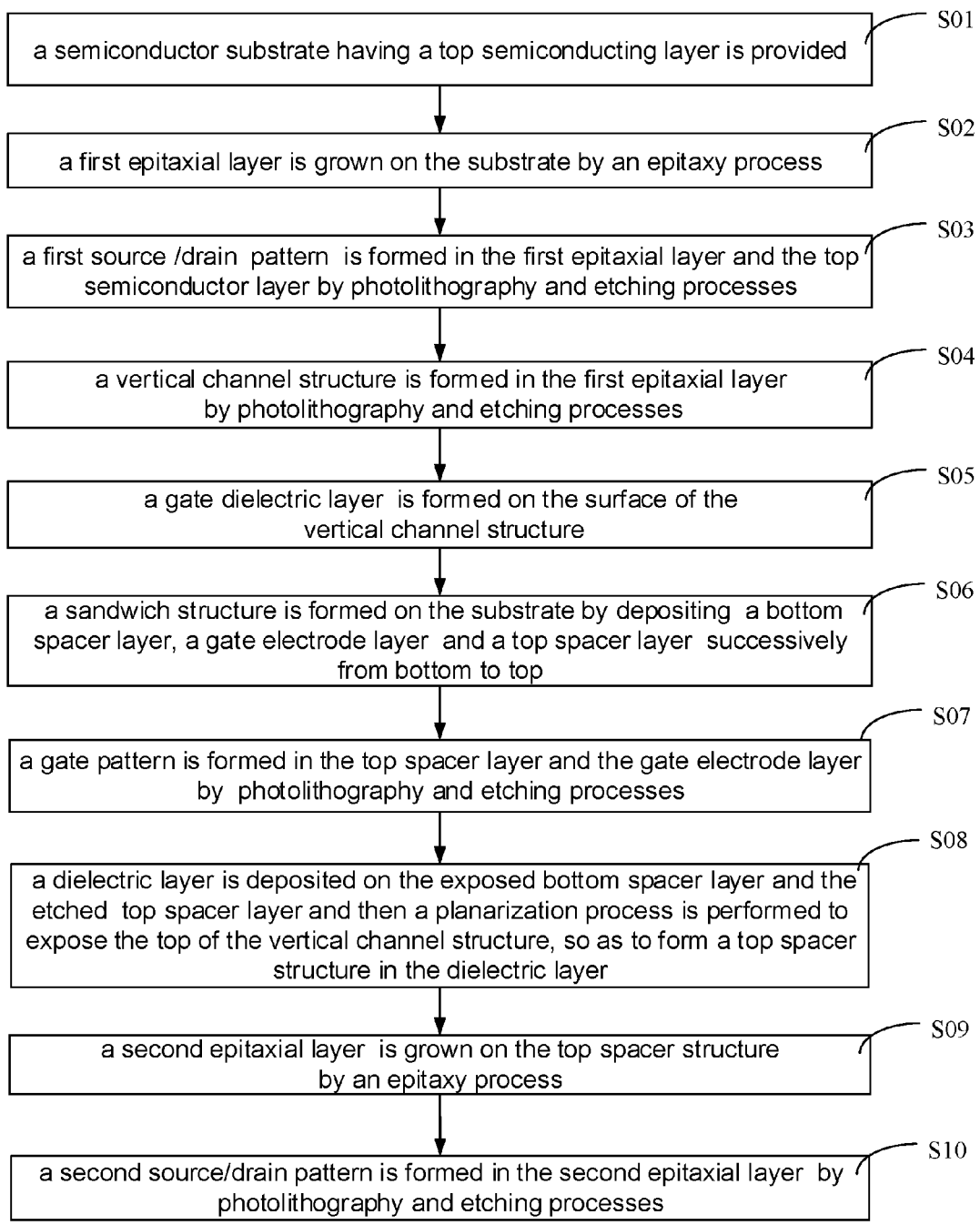
FIG. 2 is a flow chart of the manufacturing method of the vertical channel gate-all-around MOSFET by epitaxy processes according to an embodiment of the present invention

The manufacturing method of a vertical channel gate-all-around MOSFET by epitaxial processes will be described in more details hereinafter with the embodiments and the FIGS. 2 to 12. FIG. 2 illustrates the manufacturing procedure of the vertical channel gate-all-around MOSFET by epitaxy processes according to an embodiment of the present invention. FIGS. 3 to 12 are cross-section views illustrating the manufacturing steps of the vertical channel gate-all-around MOSFET by epitaxy processes according to the embodiment of the present invention. The drawings are not necessarily to scale, emphasis instead being placed upon illustrating the principles of the present invention.

As previously mentioned, the conductive channel of the gate-all-around MOSFET structure is perpendicular to the substrate surface and is surrounded by the gate electrode to form the gate-all-around device structure, thus a desirable subthreshold performance can be achieved. In addition, the critical dimension of the gate electrode is defined by deposition process without any photolithography techniques so that the device size can be further scaled easily. Although the MOSFET structure has such advantages as mentioned above, there still lacks a manufacturing process for vertical channel gate-all-around MOSFETs compatible with the traditional CMOS process. Accordingly, the present invention provides a manufacturing method of a vertical channel gate-all-around MOSFET compatible with the conventional CMOS process to enable the device to be fabricated by the conventional equipments, thereby avoiding the cost increasing and overcoming the process difficulties of the device with scaled size.

Figure 3:
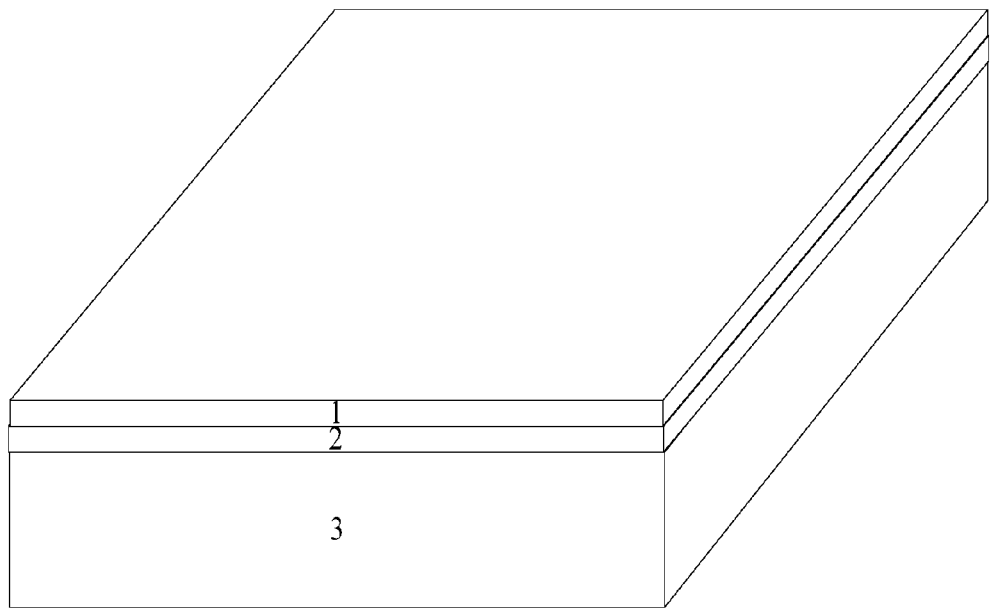
FIGS. 3 to 12 are cross-section views illustrating the manufacturing steps of the vertical channel gate-all-around MOSFET by epitaxy processes according to the embodiment of the present invention

Referring to FIG. 2, the manufacturing method of a vertical channel gate-all-around MOSFET by epitaxial processes according to an embodiment of the present invention includes the following steps:

Step S01, Referring to FIG. 3, a semiconductor substrate having a top semiconducting layer 1 is provided;

The substrate can be any substrate including the top semiconducting layer 1, such as a substrate consisting of a bottom layer, a middle dielectric layer, and a top layer, or a silicon on insulator substrate, or a germanium on insulator substrate, etc. In the embodiment of the present invention, the substrate is a silicon on insulator substrate having a middle dielectric layer 2 sandwiched by a bottom layer 3 and the top semiconducting layer 1. In another embodiment of the present invention, the substrate can be a germanium on insulator substrate, which is not limited thereto.

The material of the top semiconducting layer 1 can be Si, Ge, GeSi, or III-V compounds. In the embodiment of the present invention, the material of the top semiconducting layer 1 is silicon, which is used as the material of the subsequent source/drain pattern. Thus, a source/drain implantation is performed into the top semiconducting layer 1 to form a first source/drain region before growing the first epitaxial layer. The source/drain implantation can be N+ or P+ according to the fabricated device type. The detailed procedure of the conventional source/drain implantation is well-known by those skilled in the art and is omitted herein. The process parameters of the source/drain implantation can be tuned according to the device performance requirement, which is not limited herein.

Figure 4:
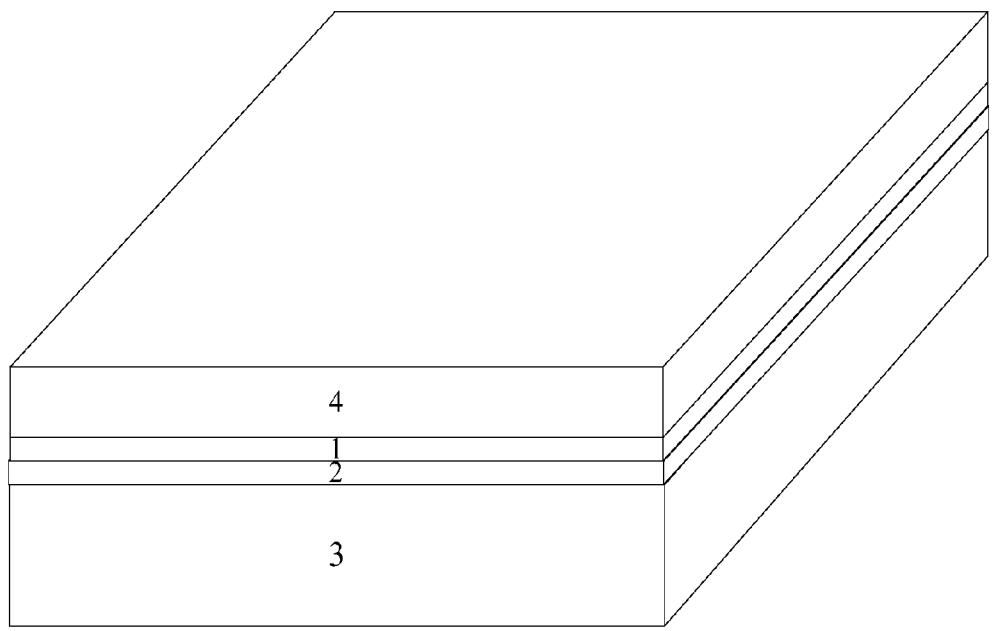

Step S02, referring to FIG. 4, a first epitaxial layer 4 is grown on the substrate by an epitaxy process.

Specifically, in the present invention, the epitaxy process can be any general epitaxial growth method, for example molecular beam epitaxy. Referring to FIG. 4, in the embodiment, the first epitaxial layer 4 is epitaxial grown on the top semiconducting layer 1. The material of the first epitaxial layer 4 can be Si, Ge, GeSi, or III-V compounds. It is noted that the material of the first epitaxial layer 4 is different from that of the top semiconducting layer 1. In the embodiment, the material of the top semiconducting layer 1 is silicon, and thus the material of the first epitaxial layer 4 can be any semiconductor materials except silicon. Preferably, the material of the first epitaxial layer 4 is Ge, GeSi or III-V compounds.

Figure 5:
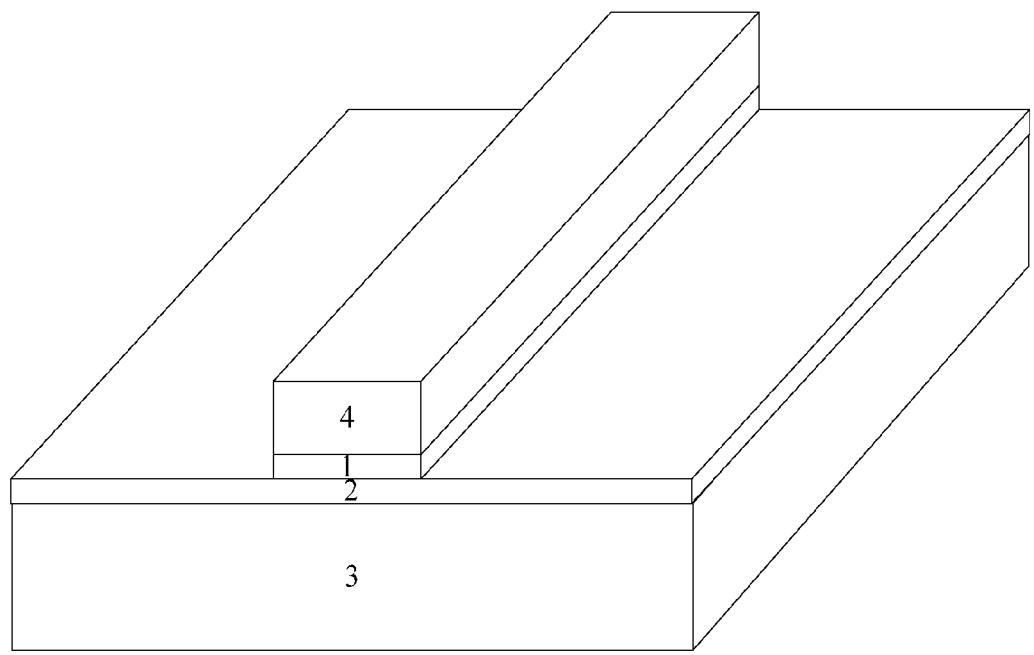

Step S03, referring to FIG. 5, a first source/drain pattern is formed in the first epitaxial layer 4 and the top semiconducting layer 1 by photolithography and etching processes.

Specifically, the photolithography process is firstly performed by coating a photo resist on the first epitaxial layer and exposing and developing to define a source/drain pattern in the photo resist; then the etching process is performed by anisotropic etching the first epitaxial layer 4 and the top semiconducting layer 1. As a result, the first source/drain pattern is formed in the top semiconducting layer 1. It is noted that during the anisotropic etching, the first epitaxial layer 4 is etched inevitably and the first source/drain pattern is also formed in the first epitaxial layer 4.

Figure 6:
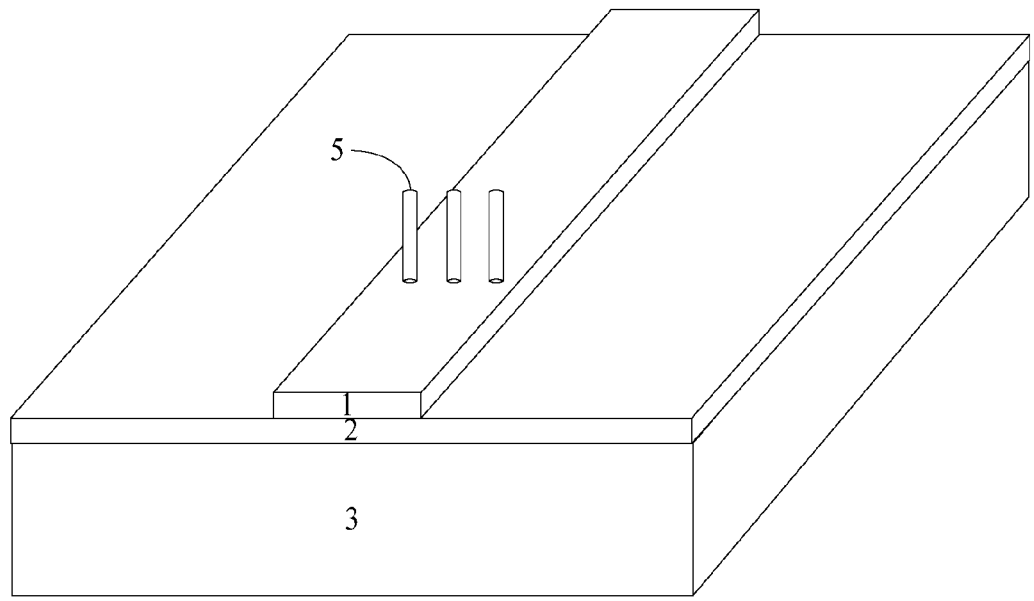

Step S04, referring to FIG. 6, a vertical channel structure 5 is formed in first epitaxial layer 4 by photolithography and etching processes.

Specifically, referring to FIG. 6, in the embodiment of the present invention, the photolithography process is performed firstly by coating a photo resist on the first epitaxial layer 4 and exposing and developing to define a vertical channel structure pattern in the photo resist; then the etching process is performed by anisotropic etching the first epitaxial layer 4. As a result, a vertical channel structure 5 is formed in the first epitaxial layer 4. In particular, the vertical channel structure 5 is formed on the first source/drain pattern.

Figure 7:
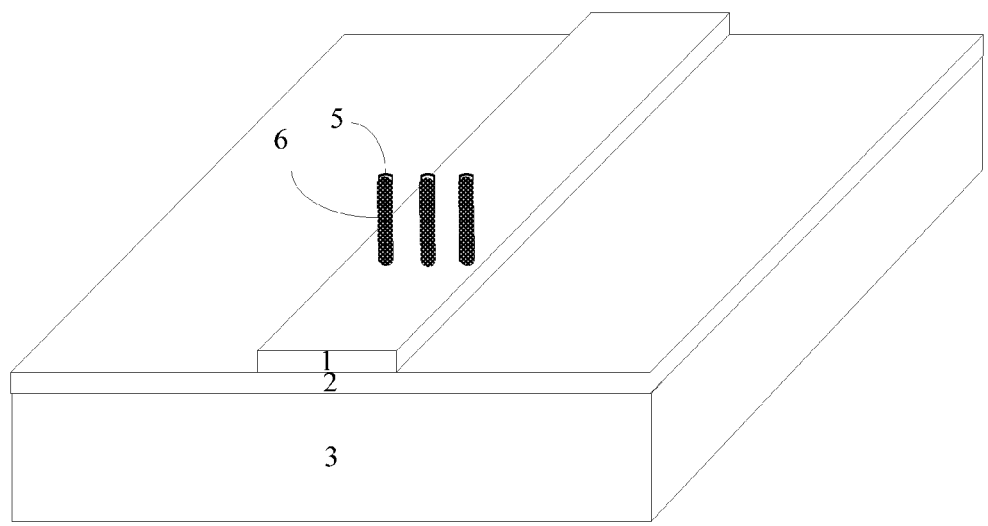

Step S05, referring to FIG. 7, a gate dielectric layer 6 is formed on the surface of the vertical channel structure 5.

Specifically, the gate dielectric layer 6 can be formed by physical deposition techniques or chemical deposition techniques. The material of the gate dielectric can be high-K dielectric, SiO2, etc. The gate dielectric layer 6 can be formed by different methods according to the material of the vertical channel structure 5. As mentioned above, the material of the first epitaxial layer 4 is different from that of the semiconducting top layer 1, the material of the top semiconducting layer 1 is silicon and the material of the first epitaxial layer 4 is any semiconductor materials except silicon comprising Ge, GeSi or III-V compounds, therefore the gate dielectric layer 6 can be a high-k dielectric layer formed by atomic layer deposition. In the case that the material of the first epitaxial layer 4 is silicon, the gate dielectric layer 6 can also be a SiO2 gate dielectric layer formed by thermal oxidation.

Figure 8:
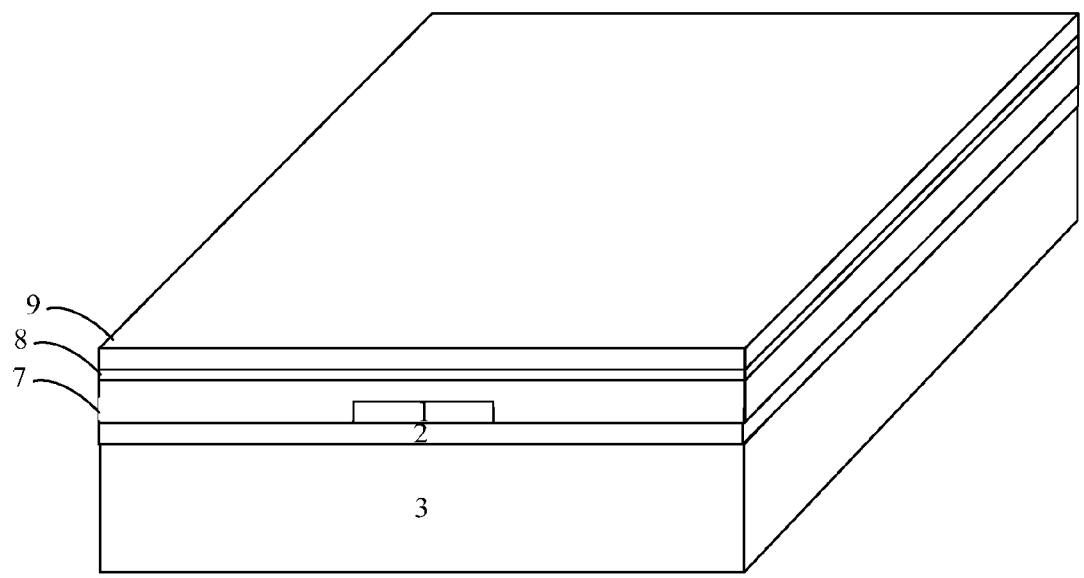

Step S06, referring to FIG. 8, a sandwich structure is formed on the substrate by depositing a bottom spacer layer 7, a gate electrode layer 8 and a top spacer layer 9 successively from bottom to top.

Specifically, the sandwich structure can be deposited by physical deposition techniques, or chemical deposition techniques. In the embodiment of the present invention, the bottom spacer layer 7, the gate electrode layer 8 and the top spacer layer 9 are deposited successively from bottom to top by chemical vapor deposition so as to form the sandwich structure. The top of the gate electrode layer 8 is lower than that of the vertical channel structure 5.

Furthermore, after the sandwich structure is formed, the top spacer layer is planarized by chemical mechanical polishing. The bottom spacer layer 7 and the top spacer layer 9 isolate the gate electrode from the source and drain patterns. The material of the gate electrode layer 8 can be polysilicon, metal, or other materials, which is not limited herein.

Figure 9:
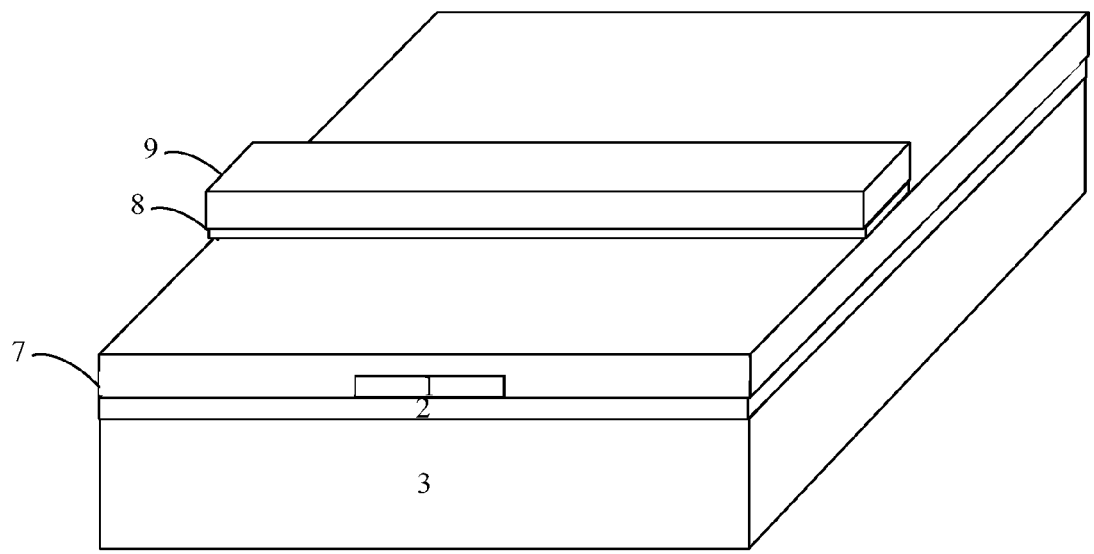

Step S07, referring to FIG. 9, a gate pattern is formed in the top spacer layer 9 and the gate electrode layer 8 by photolithography and etching processes.

Specifically, a photolithography process is performed firstly by coating a photo resist on the top spacer layer 9 and exposing and developing to form a gate pattern in the photo resist; then an etching process is performed by anisotropic etching the top spacer layer 9 and the gate electrode layer 8. As a result, a gate pattern is formed in the gate electrode layer 8, and the vertical channel structure 5 passes through the gate pattern. It is noted that during the anisotropic etching process, the top spacer layer 9 is etched inevitably and thus the gate pattern is also formed in the top spacer layer, however, it is not limited thereto.

It is noted that after the gate pattern is formed, an implantation can be performed into the gate electrode according to the process requirement. The implantation can also be omitted when the gate electrode layer 8 is a metal layer.

Figure 10:
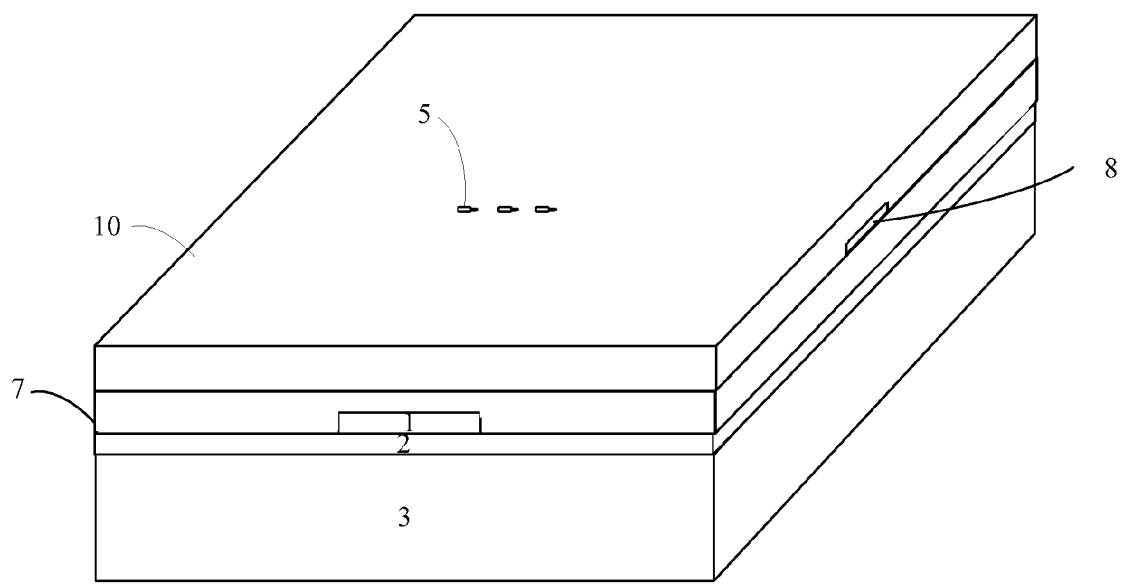

Step S08, referring FIG. 10, a dielectric layer is deposited on the exposed bottom spacer layer 7 and the etched top spacer layer 9 (not shown in FIGS. 10 to 12) and a planarization process is performed to expose the top of the vertical channel structure 5, so as to form a top spacer structure 10 in the dielectric layer.

Specifically, after the anisotropic etching process in the step S07 is performed, the top spacer layer 9 which is used to isolate the gate electrode layer 8 from source and drain electrodes is partly etched. Therefore, it is necessary to deposit another dielectric layer to repair the top spacer layer 9 so as to isolate the gate electrode layer 8 from the source/drain pattern. It is noted that the top spacer structure 10 covers the exposed sidewalls of the gate pattern so as to isolate the gate pattern from the subsequent second source/drain pattern. In the embodiment of the present invention, the dielectric layer and/or the etched top spacer layer 9 is polished by chemical mechanical polishing until the top of the vertical channel structure 5 is exposed and thus the top spacer structure 10 is formed in the dielectric layer.

Figure 11:
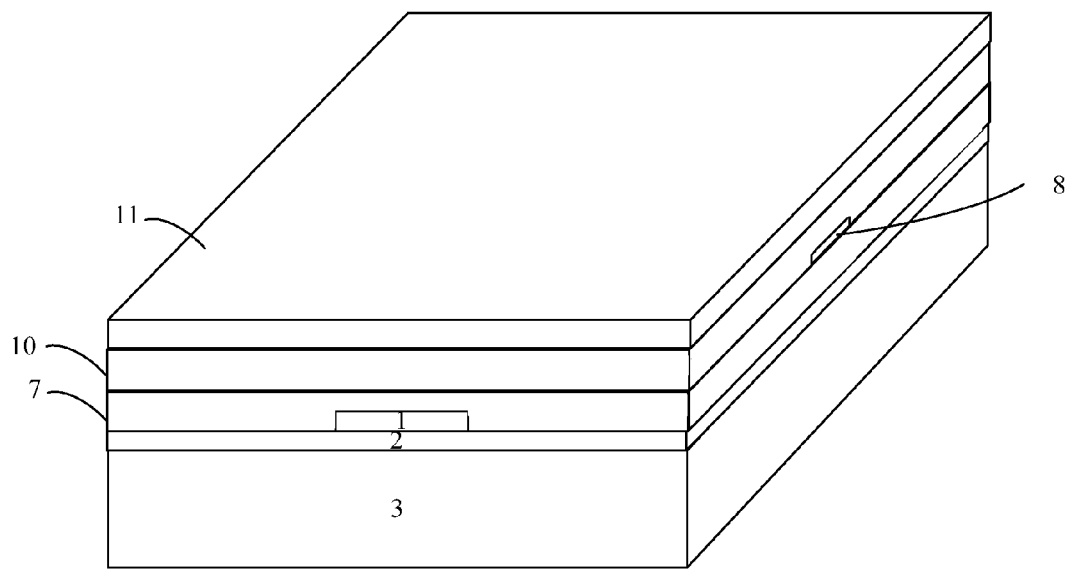

Step S09, referring to FIG. 11, a second epitaxial layer 11 is grown on the top spacer structure 10 by an epitaxy process.

Specifically, the second epitaxial layer 11 is formed by an epitaxial growth method like molecular beam epitaxy. The second epitaxial layer 11 has the same material with the top semiconducting layer 1, which ensures the symmetry between the second source/drain pattern formed in the second epitaxial layer 11 and the first source/drain pattern formed in the top semiconducting layer 1. In the embodiment of the present invention, the material of the top semiconducting layer 1 is silicon, accordingly the material of the second epitaxial layer 11 is also silicon. In addition, the material of the first epitaxial layer 4 is different from that of the second epitaxial layer 11, and can be any semiconductor materials except silicon. In another embodiment, the material of the top semiconducting layer 1 is Ge, the material of the second epitaxial layer 11 is also Ge. Correspondingly, the material of the first epitaxial layer 4 can be any semiconductor materials except Ge.

Figure 12:
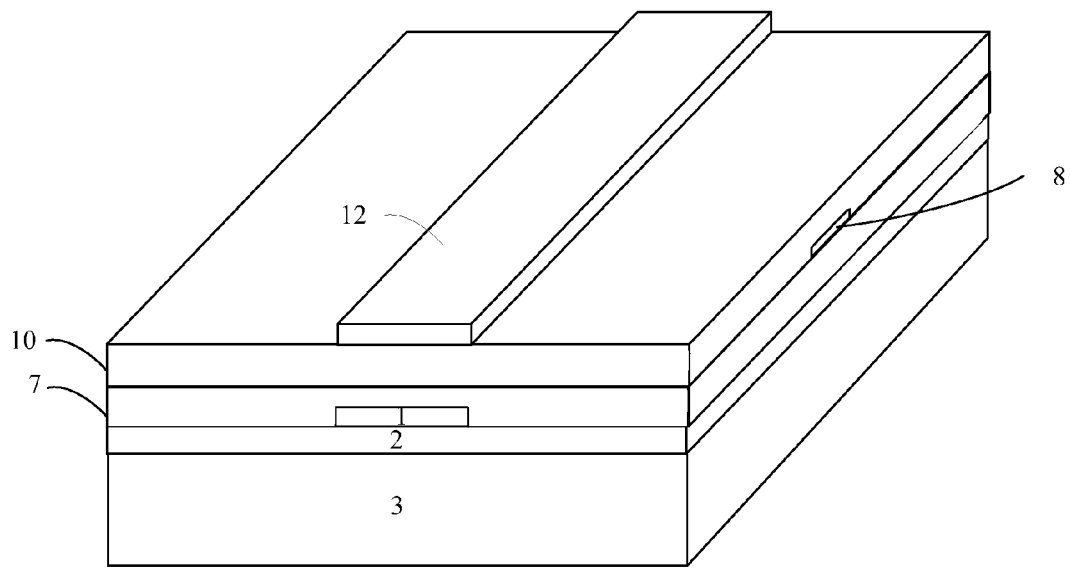

Step S10, referring to FIG. 12, a second source/drain pattern 12 is formed in the second epitaxial layer 11 by photolithography and etching processes.

Specifically, a second source/drain pattern is firstly defined by the photolithography process, and then a second source/drain pattern 12 is formed in the second epitaxial layer 11 by anisotropic etching. The second source/drain pattern 12 naturally connects with the top of the vertical channel structure 5. Herein any etching processes by which the second source/drain pattern 12 can be formed in the second epitaxial layer 11 is involved in the scope of the present invention, such as the wet chemical etching. In the embodiment, the shape of the second source/drain pattern 12 is the same as that of the first source/drain pattern and the horizontal projections thereof are overlapped. The second source/drain pattern 12 in the second epitaxial layer 11 and the first source/drain pattern in the top semiconducting layer 1 are symmetrical, thereby ensuring the symmetry of the two source/drain patterns. It should be noted that the first source/drain pattern and the second source/drain pattern 12 are used as a source electrode and a drain electrode separately. When the first source/drain pattern is used as the source electrode, the second source/drain pattern is used as the drain electrode correspondingly. When the first source/drain pattern is used as the drain electrode, the second source/drain pattern is used as the source electrode correspondingly.

In the embodiment of the present invention, the material of the second epitaxial layer is silicon, therefore before the second source/drain pattern formed, a source/drain implantation is performed into the second epitaxial layer 11. The implantation process parameters (like implant-type and dose, etc.) can be tuned according to the device type and device performance requirement.

After the second source/drain pattern 12 is formed, the back-end-of-line processes can be performed by conventional techniques, such as formation of the contact/via holes, planarization, formation of the metal interconnections, etc. Since the back-end-of-line processes are known by those skilled in the art, it is not described detailedly in the present invention.

According to the disclosed methods of the present invention, a vertical channel gate-all-around MOSFET is formed by performing two epitaxy processes to grow two epitaxial layers of different materials separately. The process according to the present invention is well compatible with the conventional CMOS process and allows the device to be fabricated using the conventional equipments so as to reduce the production cost. When the size of the vertical channel structure further decreases, the method can also be applied to manufacture a nanowire transistor with vertical channel, which overcomes the technical difficulties in manufacturing the devices with smaller size than the FinFETs. Due to the selection flexibility of the materials that can be used in the epitaxy processes, the method according to the present invention can also be applied to fabricate FETs having different channel materials such as Ge, GeSi, or III-V compounds, etc., which expands the application of the device.

While this invention has been particularly shown and described with references to preferred embodiments thereof, if will be understood by those skilled in the art that various changes in form and details may be made herein without departing from the spirit and scope of the invention as defined by the appended claims.

What is claimed is:
1. A method of manufacturing a vertical channel gate-all-around MOSFET by epitaxy processes, comprising:
Step S01: choosing a semiconductor substrate having a top semiconducting layer;
Step S02: growing a first epitaxial layer on the top semiconducting layer by an epitaxy process; wherein the material of the first epitaxial layer is different from that of the top semiconducting layer;
Step S03: forming a first source/drain pattern in the first epitaxial layer and the top semiconducting layer by photolithography and etching processes;
Step S04: forming a vertical channel structure in the first epitaxial layer by photolithography and etching processes;
Step S05: forming a gate dielectric layer on the vertical channel structure surface;
Step S06: forming a sandwich structure by depositing a bottom spacer layer, a gate electrode layer and a top spacer layer successively on the semiconductor substrate;
Step S07: forming a gate pattern in the top spacer layer and the gate electrode layer by photolithography and etching processes;
Step S08: forming a top spacer structure by depositing a dielectric layer on the patterned top spacer layer and the exposed bottom spacer layer and then performing a planarization process to expose the top of the vertical channel structure;
Step S09: growing a second epitaxial layer on the top spacer structure by an epitaxy process;
Step S10: forming a second source/drain pattern in the second epitaxial layer by photolithography and etching processes.

2. The method according to claim 1, wherein the vertical channel structure is formed on the first source/drain pattern; the vertical channel structure passes through the gate electrode layer with the top thereof higher than that of the gate electrode layer; the top of the vertical channel structure naturally connects with the second source/drain pattern; wherein when the first source/drain pattern is used as the source electrode, the second source/drain pattern is used as the drain electrode; when the first source/drain pattern is used as the drain electrode, the second source/drain pattern is used as the source electrode.

3. The method according to claim 1, wherein the method further includes a step of source/drain implantation process in the top semiconducting layer of the substrate before growing the first epitaxial layer and a step of source/drain implantation process in the second epitaxial layer before forming the second source/drain pattern.

4. The method according to claim 1, wherein the etching processes in the step S03, the step S04, the step S06 and the step S10 are anisotropic etching processes.

5. The method according to claim 1, wherein in the step S05, the gate dielectric layer is formed by thermal oxidation or atomic layer deposition.

6. The method according to claim 1, wherein the step S06 further includes planarizing the top spacer layer by chemical mechanical polishing.

7. The method according to claim 1, wherein in the step S08, the dielectric layer is planarized by chemical mechanical polishing.

8. The method according to claim 1, wherein the material of the second epitaxial layer is the same as that of the top semiconducting layer.

9. The method according to claim 1, wherein the substrate is a silicon on isolator substrate or a germanium on isolator substrate; the first source/drain pattern and the second source/drain pattern are symmetrical.

10. The method according to claim 1, wherein the materials of the first epitaxial layer, the second epitaxial layer and the top semiconducting layer are selected from the group of Si, Ge, GeSi, and III-V compounds.

\* \* \* \* \*